United States Patent [19]

Sokolich

[11] Patent Number: 5,471,077
[45] Date of Patent: Nov. 28, 1995

[54] HIGH ELECTRON MOBILITY TRANSISTOR AND METHODE OF MAKING

[75] Inventor: Marko Sokolich, Los Angeles, Calif.

[73] Assignee: Hughes Aircraft Company, Los Angeles, Calif.

[21] Appl. No.: 774,503

[22] Filed: Oct. 10, 1991

[51] Int. Cl.$^6$ .................... H01L 29/161; H01L 29/205; H01L 29/48; H01L 29/56
[52] U.S. Cl. .................. 257/192; 257/280; 257/473
[58] Field of Search ................. 257/192, 194, 257/195, 280, 284, 472, 473

[56] References Cited

U.S. PATENT DOCUMENTS

| | | | |
|---|---|---|---|
| 4,544,238 | 10/1985 | Nickol | 350/336 |
| 4,721,993 | 1/1988 | Walter | 357/70 |
| 4,865,193 | 9/1989 | Shimamoto et al. | 206/330 |
| 4,947,237 | 8/1990 | Fusaroli | 357/70 |
| 5,075,763 | 12/1991 | Spitzer et al. | 257/760 |

FOREIGN PATENT DOCUMENTS

| | | | |
|---|---|---|---|
| 1-150369 | 6/1989 | Japan | 257/194 |
| 3131047 | 6/1991 | Japan | H01L 21/60 |

OTHER PUBLICATIONS

A. K. Sinha et al., n–GaAs Skhottky Diodes Metallized with Ti and Pt/Ti, Solid State Electronics, 1976, vol. 19, pp. 489–492.

N. Toyoda et al., An Applicaiton of Pt–GaAs Solid Phase Reaction to GaAs and Related Compounds, Gallium Arsenide and Related Compounds 1981, Inst. Phys. Conf. Ser. 63, Bristol and London, Institute of Physics, p. 521 (1982).

*Primary Examiner*—Andrew J. James
*Assistant Examiner*—D. Monin
*Attorney, Agent, or Firm*—Jeanette M. Walder; Georgann S. Grunebach; W. K. Denson-Low

[57] ABSTRACT

A high electron mobility transistor (HEMT) includes a diffusion barrier (22) to prevent gate metal (20) diffusion into the substrate (12) during fabrication and a sacrificial platinum alloy layer (30) forms the Schottky barrier. A method of forming a HEMT includes forming a diffusion barrier of titanium nitride on a platinum layer and applying sufficient heat to cause the platinum layer to alloy with the gallium arsenide layer forming a platinum gallium and platinum arsenide alloy layer and Schottky barrier. Since all platinum is consumed, this method permits precise control of the thickness of the gate layer and eliminates diffusion of the platinum gate layer into the gallium arsenide layer during later processing steps.

4 Claims, 9 Drawing Sheets

HIGH ELECTRON MOBILITY TRANSISTOR AND METHODE OF MAKING

TECHNICAL FIELD

This invention relates to heterostructure devices, and, in particular, to heterostructure field effect transistor (FET) devices known as the high electron mobility transistor (HEMT).

BACKGROUND OF THE INVENTION

The basic structure of a HEMT device includes a current carrying active layer consisting of an epitaxial layer of high purity semiconductor such as gallium arsenide (GaAs) on a semi-insulating substrate. On top of the active layer is a thin, fairly heavily doped N-type gate layer of a wider gap semiconductor such as aluminum gallium arsenide (AlGaAs). On top of the gate layer is a Schottky barrier. The Schottky barrier is typically formed by depositing a layer of metal such as platinum on the aluminum gallium arsenide gate layer. The thickness and doping of the gate layers are chosen such that at the desired operating bias all electrons have been depleted from the gate layer underneath the Schottky barrier. Hence, the accumulated electrons in the potential notch on the active-layer side of the heterojunction carry the entire source-to-drain current in the device. By modulating the bias applied to the Schottky barrier gate, the bias across the heterojunction is modulated, which in turn modulates the sheet concentration of the accumulated electrons and hence the source to drain current. This electron region is also called the two dimensional electron gas (2-DEG) layer. Because the electron conduction takes place in a very thin, two-dimensional sheet adjacent to the gate layer, the device is also sometimes referred to as a two-dimensional electron gas FET.

Fabrication of gallium arsenide devices is generally more difficult than fabrication of silicon type devices. Fabrication of gallium arsenide devices capable of operating at microwave frequency involves the formation of sub-micron and micron features, as well as much larger structures, on and in the surface of a single crystal gallium arsenide chip. A gallium arsenide device is typically formed by providing a gallium arsenide single crystal wafer as the substrate for fabrication. Using either ion implantation or epitaxial deposition, a continuous N-type layer of aluminum gallium arsenide is formed over the entire wafer surface. To provide isolation, the N-type active layer is mesa etched to remove it from all areas of the wafer except where the active devices will be formed. This is done using conventional contact photolithography to pattern a photoresist layer to protect those areas of the surface where the active area is to remain during wet chemical etching.

Then the source/drain ohmic contact metallization is formed. A gold germanium nickel layer is evaporated and defined by photoresist liftoff, (liftoff being a preferred technique used extensively to pattern metals on gallium arsenide). Liftoff is preferred over etching because the gallium arsenide surfaces are readily damaged by many of the chemicals commonly employed to etch metal patterns and liftoff produces steeper metal edges. After deposition and liftoff of the source/drain metal layer, alloying at 430° C. for three minutes forms ohmic contacts to the gallium arsenide. The ohmic contact metal layer is also used to form alignment marks used by the electron beam exposure system to precisely locate the critical sub-micron gate pattern.

The gate region is formed by electron beam exposure and development of a photoresist mask layer, then the gate area is recessed using a wet etch to achieve the desired device current, and then a metal, usually titanium, platinum, gold or some other combination, is evaporated and defined by a liftoff process similar to that used for ohmic contacts. A major problem with the gate recessed etch step is that it is time-consuming, inaccurate and often subjects the thin, sensitive, molecular beam epitaxial layers to caustic etchants and exposes the underlying layers to air resulting in oxidation.

After the metal gate is deposited, it is alloyed to the gallium arsenide layer by heat. Thin, sequential layers of titanium and gold are deposited and patterned by liftoff to overlay the alloyed source and drain regions and to overlay the alloy gate region to reduce the spreading resistance. These layers of gold and titanium also reduce microwave loses in various components.

In some gallium arsenide devices the ohmic contacts are formed after the gate metallization step. When the ohmic contacts to the source and drain regions are alloyed, the heat used in the alloying step can cause further diffusion of the Schottky barrier metal material, such as platinum, into the gallium arsenide region. Gate metal diffusion into the substrate is a major problem in gallium arsenide device fabrication.

A. K. Sinha et al. in their article entitled, "n-GaAs Schottky Diodes Metallized with Ti and Pt/Ti", Solid-State Electronics, vol. 19, pp. 489–492, 1976, discuss the electrical characteristics and interdiffusion in n-GaAs Schottky diodes containing titanium and platinum titanium gate metallization. This paper also describes basic materials science and Schottky properties of the platinum gallium arsenide interface. N. Toyoda et al., "An Application of Pt—GaAs Solid Phase Reaction to GaAs and Related Compounds", in Gallium Arsenide and Related Compounds 1981, Institute of Physics Conference Serial 63, Bristol and London, Institute of Physics, p. 521 (1982), discuss the problems of the basic platinum gallium arsenide junction. Toyoda et al. note that the platinum gallium arsenide junction shows good Schottky characteristics after being sintered below 500° C. while it degrades above 500° C. At 400° C. platinum reacts with gallium arsenide at the diffusion limited rate in the early stage, and completely reacts after a later period of time.

SUMMARY OF THE INVENTION

It is an object of the invention to provide an improved high electron mobility transistor in which the platinum Schottky barrier layer does not diffuse into the gallium arsenide layer. It is another object of the invention to provide an improved technique for fabricating planar high electron mobility transistors. It is yet another object of the invention to provide a method of forming or manufacturing a high electron mobility transistor without the gate recess etch step.

To achieve these and other objects, a high electron mobility transistor according to the invention may comprise a current carrying active layer formed of an epitaxial layer of gallium arsenide on a semi-insulating substrate, the active layer including source and drain regions; a gate layer of aluminum gallium arsenide on the active layer; a Schottky barrier layer on the gate layer, the Schottky barrier layer being formed of a metal alloy comprising platinum gallium and platinum arsenide; a diffusion barrier layer of titanium nitride on the Schottky barrier and ohmic contacts formed on the gate, source and drain regions. A method of making a high electron mobility transistor according to the invention may comprise the steps of forming a current carrying active layer comprising an epitaxial layer of gallium arsenide on a semi-insulating substrate; forming a doped gate layer of aluminum gallium arsenide on the active layer wherein the active layer includes a source and a drain region; forming a cap layer of gallium arsenide on the doped gate layer; forming a layer of platinum on the cap layer; forming a diffusion barrier of titanium nitride on the platinum layer; applying sufficient heat to cause the platinum layer to alloy with the gallium arsenide cap layer to form a platinum gallium and platinum arsenide alloy layer and Schottky barrier; and depositing ohmic contacts on the source and drain regions. Another method of making a high electron mobility transistor according to the invention may comprise the steps of forming a current carrying active layer comprising an epitaxial layer of gallium arsenide on a semi-insulating substrate, wherein the active layer includes a source and a drain region; forming a doped gate layer of aluminum gallium arsenide on the active layer; forming a cap layer of gallium arsenide on the doped gate layer; forming a layer of platinum on the cap layer; forming a diffusion barrier of titanium nitride on the platinum layer; depositing ohmic contacts on the gate and source and drain regions and applying sufficient heat to cause the platinum layer to alloy with the gallium arsenide cap layer to form a platinum gallium and platinum arsenide alloy layer and Schottky barrier and to cause the ohmic contacts to alloy.

Employing a diffusion barrier prevents gate metal diffusion into the substrate and the sacrificial platinum alloy layer forms a Schottky barrier. By sacrificing all the platinum in the Schottky barrier layer no further diffusion of platinum into the gallium arsenide cap layer occurs, thus eliminating the problem of diffusion during operation of the device or during subsequent fabrication steps. The resulting HEMT has the advantage of a reproducible interface that is stable at high temperatures and has superior mechanical properties because it is alloyed into the substrate. Also, small amounts of residue contaminants in the surface of the cap layer will be incorporated into the alloy and will therefore be less likely to affect the quality of the metal/semiconductor contact. The same high performance materials that are used for the commercial recessed etch process can be used without modification in the process according to the invention. Furthermore, the depth of the alloy is precisely controlled by the thickness of the first platinum layer in the gate metallization. Since the reaction of platinum with gallium arsenide produces constituents that are stable to temperatures well above the formation temperature, a constant heating cycle can be used regardless of the original metal thickness. It is therefore possible to use the same process, changing only the platinum thickness, to obtain devices of various pinch-off voltages. Devices have been fabricated according to the invention in which thicknesses of 200, 220, 250 and 300 Angstroms were used to obtain various device characteristics. Initial results indicate superior uniformity of device parameters over a wafer. The invention permits batch processing to be implemented for HEMT devices where previously each wafer had to be individually etched and monitored repeatedly until the desired current density was obtained. In prior techniques, the geometries of the lines being etched, their locations on the wafer, and the orientation of the wafer in the etch bath contributed to variations in etch depth from point to point.

These and other features and advantages of the present invention will be apparent to those skilled in the art from the following detailed description, taken together with the accompany drawings, in which like reference numerals refer to like parts.

DESCRIPTION OF THE PREFERRED EMBODIMENTS

Figure 1A:
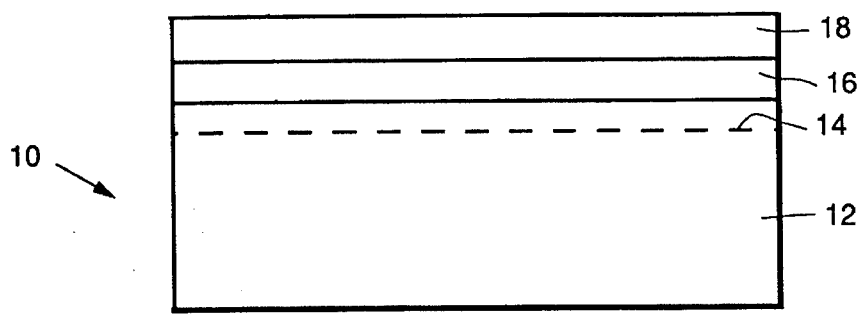
FIG. 1a–1g show various fabrication steps for fabricating a HEMT according to the invention.
Figure 1B:
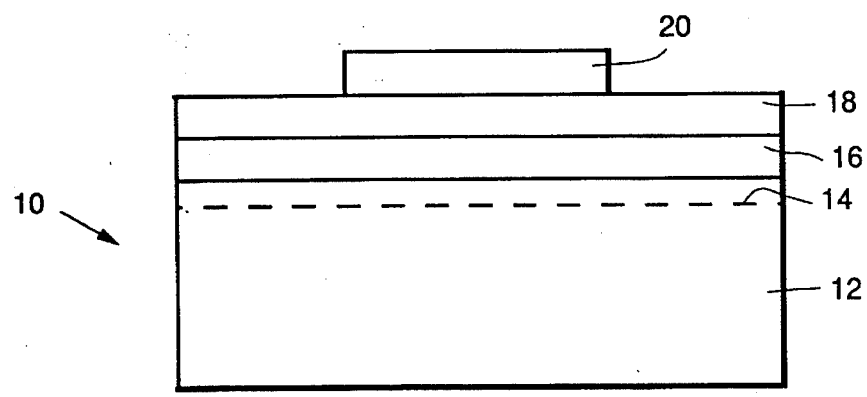
Figure 1C:
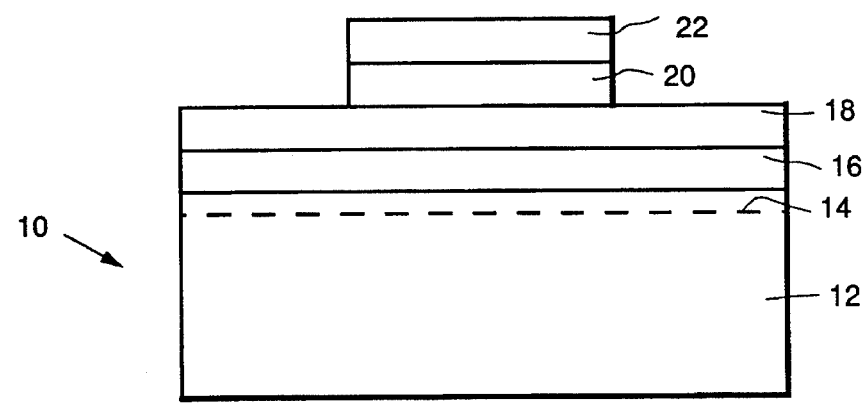
Figure 1D:
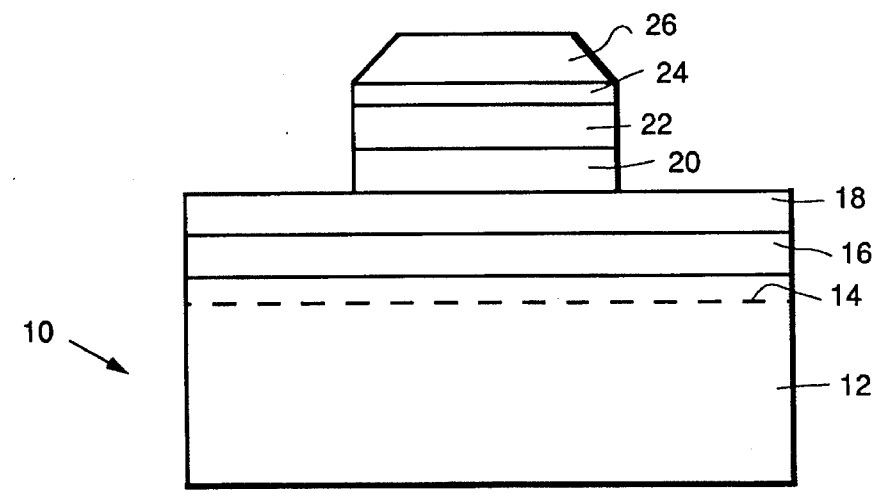
Figure 1E:
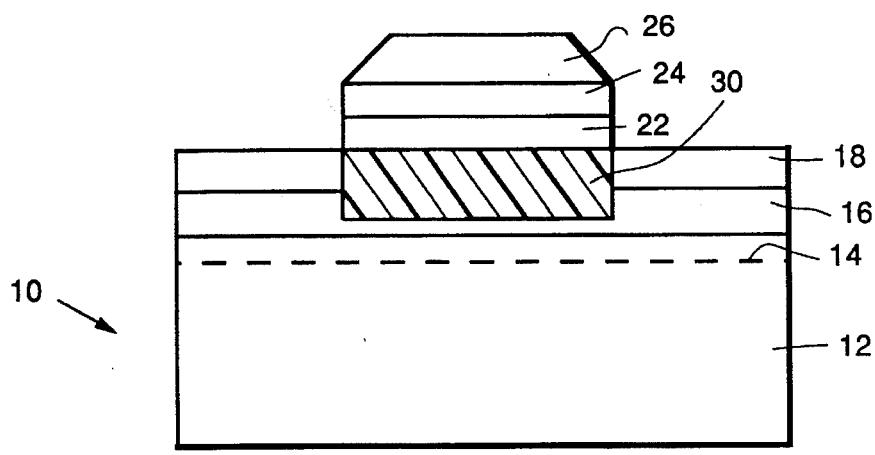
Figure 1F:
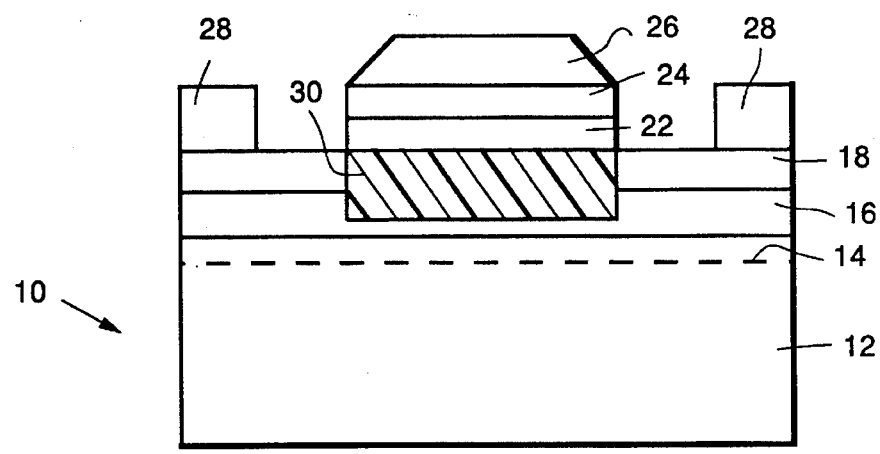
Figure 1G:
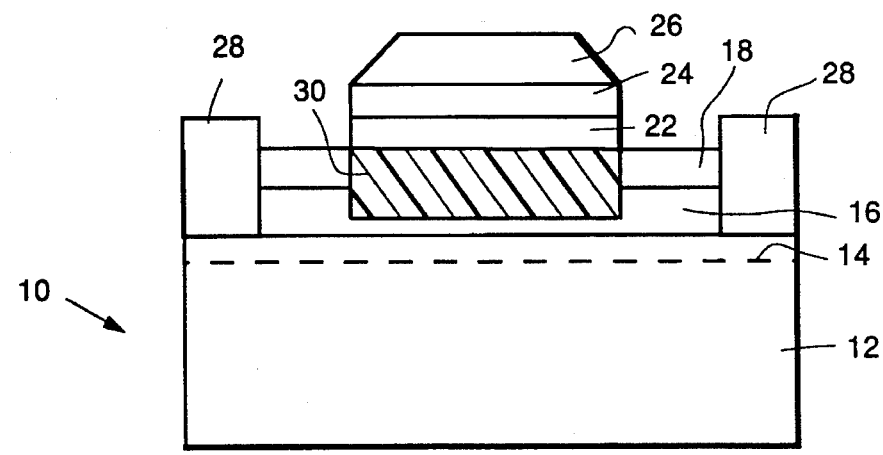

Referring to FIGS. 1a–1g, a method of forming a HEMT according to present invention is described. In FIG. 1a mesa structure 10 includes gallium arsenide substrate 12 with two dimensional electron gas region 14. On top of gallium arsenide substrate 12 is aluminum gallium arsenide gate layer 16 and gallium arsenide cap layer 18. In FIG. 1b platinum 20 is deposited and shaped. In FIG. 1c the titanium nitride diffusion barrier 22 is deposited on top of platinum layer 20. In FIG. 1d, successive layers of titanium 24 and gold 26 are deposited on top of the titanium nitride diffusion barrier layer 22. In FIG. 1e heat has been applied to the structure of FIG. 1d. causing the platinum layer 20 to alloy with gallium arsenide layer 18 until all of platinum is consumed forming platinum gallium and platinum gallium arsenide layer 30. Preferably, heat is applied at 450° C. for five minutes. This time and temperature is sufficient to obtain complete reaction in platinum films up to 400 Angstroms thick and results in an alloy depth of roughly 800 Angstroms. In FIG. 1f, metal ohmic contacts are deposited over the source and drain regions. Heat is then applied to alloy the metal ohmic contacts as shown in FIG. 1g. Ohmic contacts are deposited using conventional lithography and metallization techniques. Alloying of the ohmic contacts is accomplished using conventional cycles. The completed HEMT device is shown in FIG. 1g.

Region 30 is the layer resulting from reacting the platinum layer with the gallium arsenide cap layer. The evaporated diffusion barrier of titanium nitride permits control of the reaction of the platinum and gallium arsenide, that is, the reaction proceeds until the platinum is consumed. The depth of the reaction layer is roughly twice the thickness of original platinum layer. The reaction causes the Schottky barrier to diffuse beyond the cap layer 18 and into the gate layer 16. The recommended temperature cycle for the formation of the region 30 is 450° C. for five minutes. However, this cycle is too hot to alloy ohmic contacts 28, so they must be formed after the gate. In some cases, for very thin cap layers, the type typically used on the most advanced devices, the ohmic alloy contact cycle (420° C. for about one minute) is sufficient to react 200 Angstroms of platinum. In such a case no additional alloying is required. Titanium and gold layers 24 and 26 above the diffusion layer provide adhesion, stability and low resistance as in conventional recess gate devices. The platinum reaction does not affect the two dimensional electron gas region 14. An advantage to the method shown in FIG. 1a–1g is that the conventional gate recess etch step is entirely eliminated.

Figure 2A:
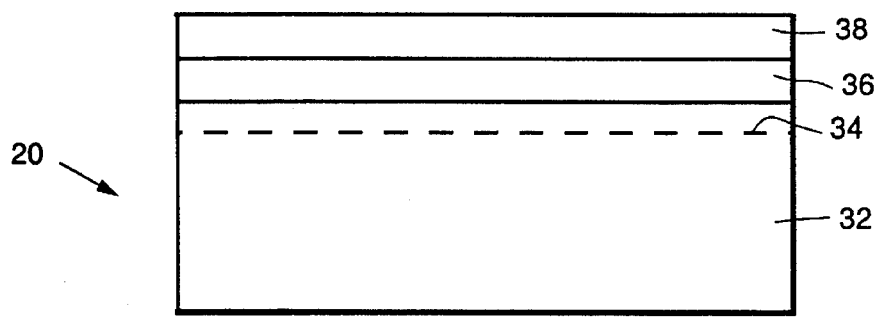
FIG. 2a–2f show various fabrication steps for an alternate method of fabricating a HEMT according to the invention.
Figure 2B:
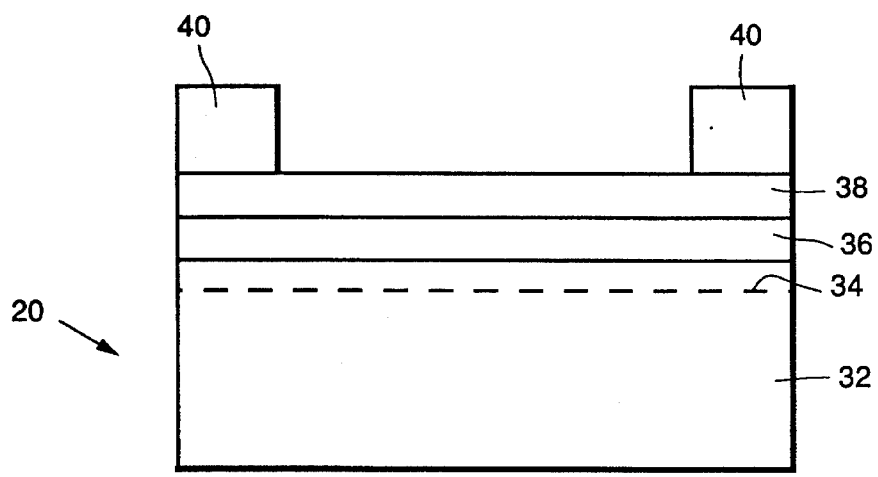
Figure 2C:
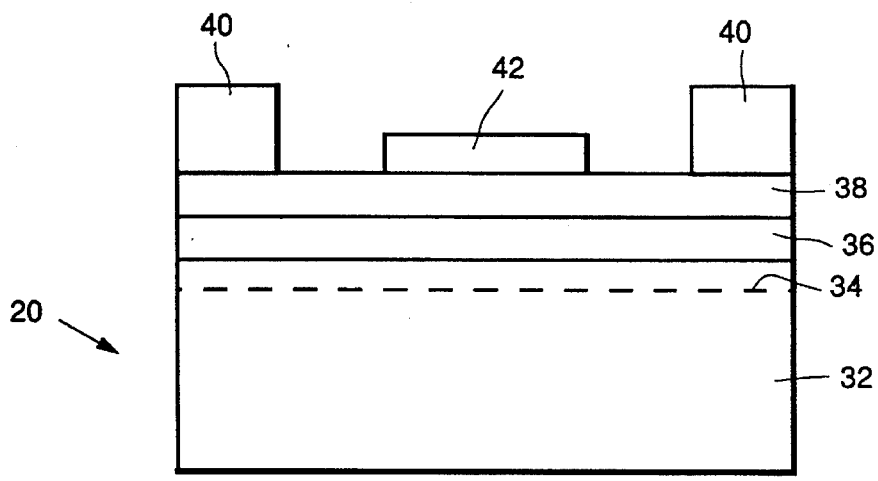
Figure 2D:
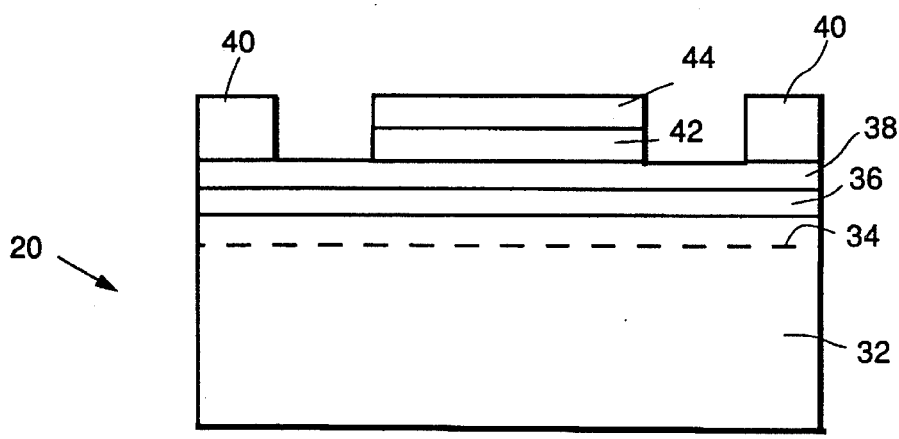
Figure 2E:
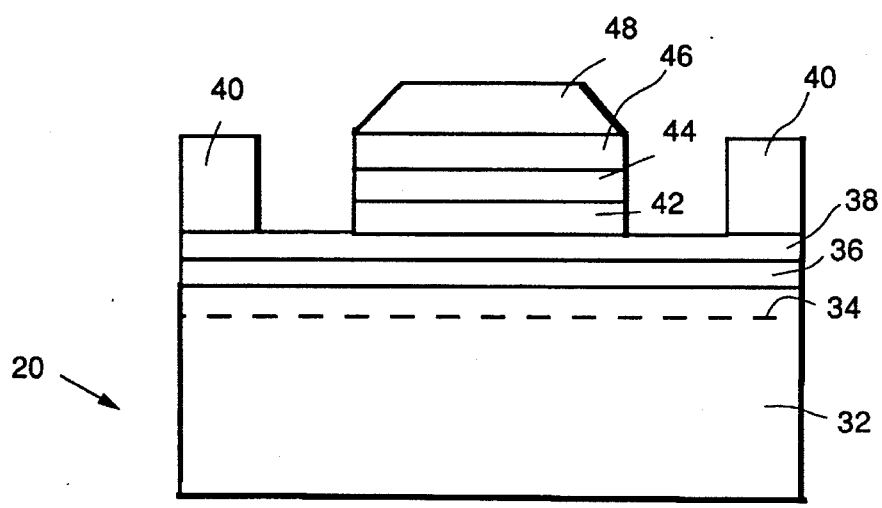
Figure 2F:
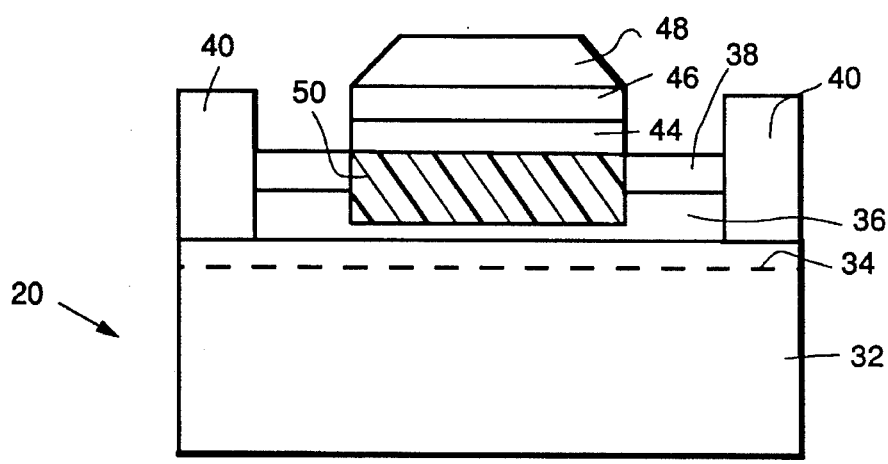

An alternative method of forming a HEMT according to the present invention is described with respect to FIGS. 2a–2f. In FIG. 2a mesa structure 20 includes gallium arsenide layer 32 with electron gas region 34, gate region formed of aluminum gallium arsenide layer 36 and gallium arsenide cap layer 38. In FIG. 2b ohmic contacts 40 are deposited over the source and drain regions using conventional lithography and conventional metallization. In FIG. 2c, before the ohmic contacts 40 are alloyed into the structure, platinum layer 42 is deposited on top of the gallium arsenide cap layer 38. In FIG. 2d a diffusion barrier 44 consisting of titanium nitride is deposited on top of the platinum layer 42. In FIG. 2e titanium layer 46 and gold layer 48 are deposited on top of the titanium nitride layer 44. FIG. 2f shows the gate finger consisting of platinum layer 42, titanium nitride 44, titanium 46, and gold 48. The thickness of the platinum 42 is chosen to determine the particular characteristics of the resulting device. In FIG. 2f is shown the resulting structure after heat has been applied at 420° C. for one minute. This is sufficient to alloy ohmic contacts 40 into and through the gallium arsenide 38 and aluminum gallium arsenide 36 layers and sufficiently react all of platinum layer 42 to form platinum gallium and platinum arsenide layer 50. The resulting device formed by the method shown in FIGS. 2a–2d saves two processing steps and uses only a single alloy step for the ohmic contact and gate metallization.

Figure 3:
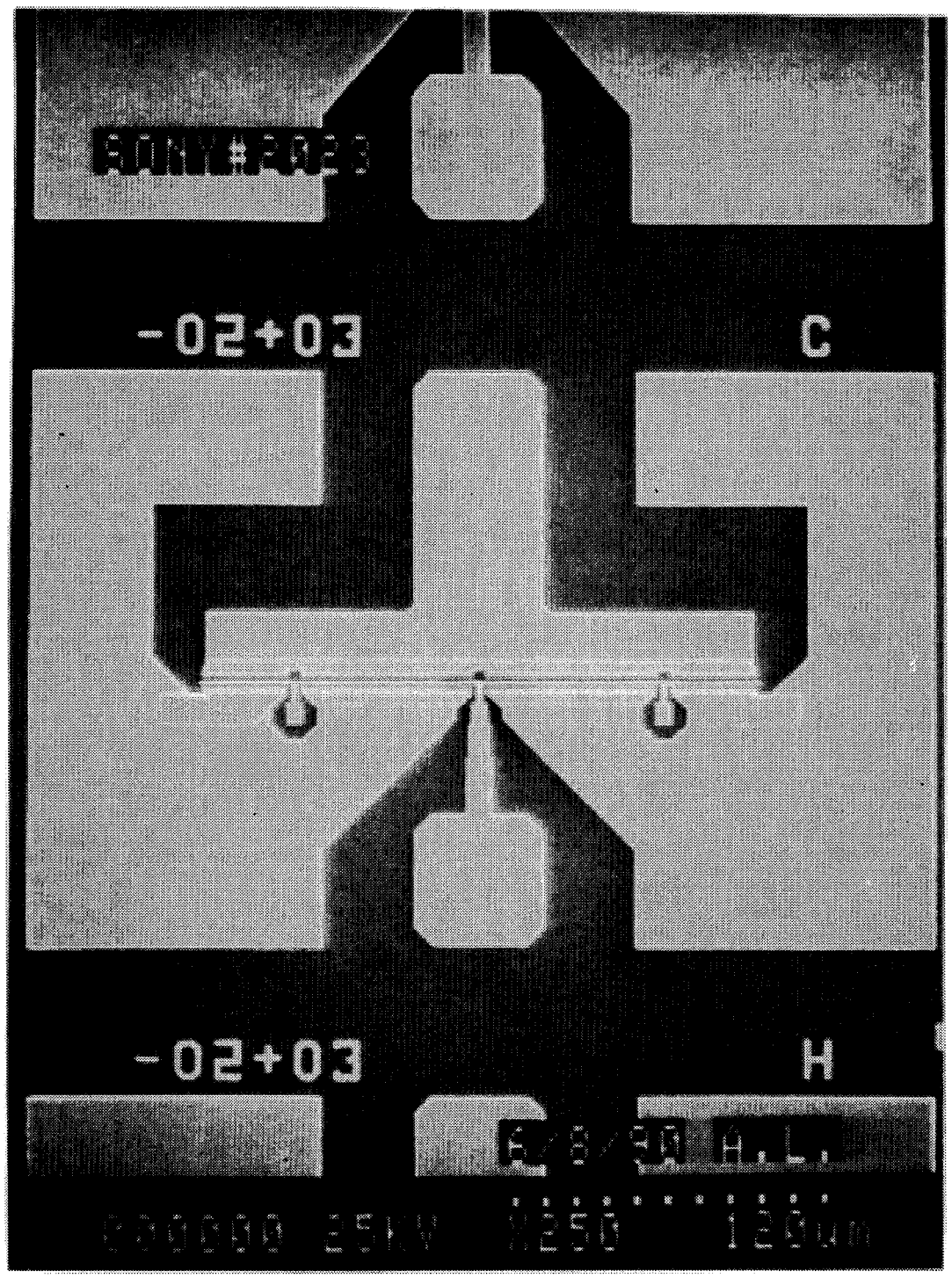
FIG. 3 is a scanning electron micrograph of a device fabricated according to the invention.
Figure 4:
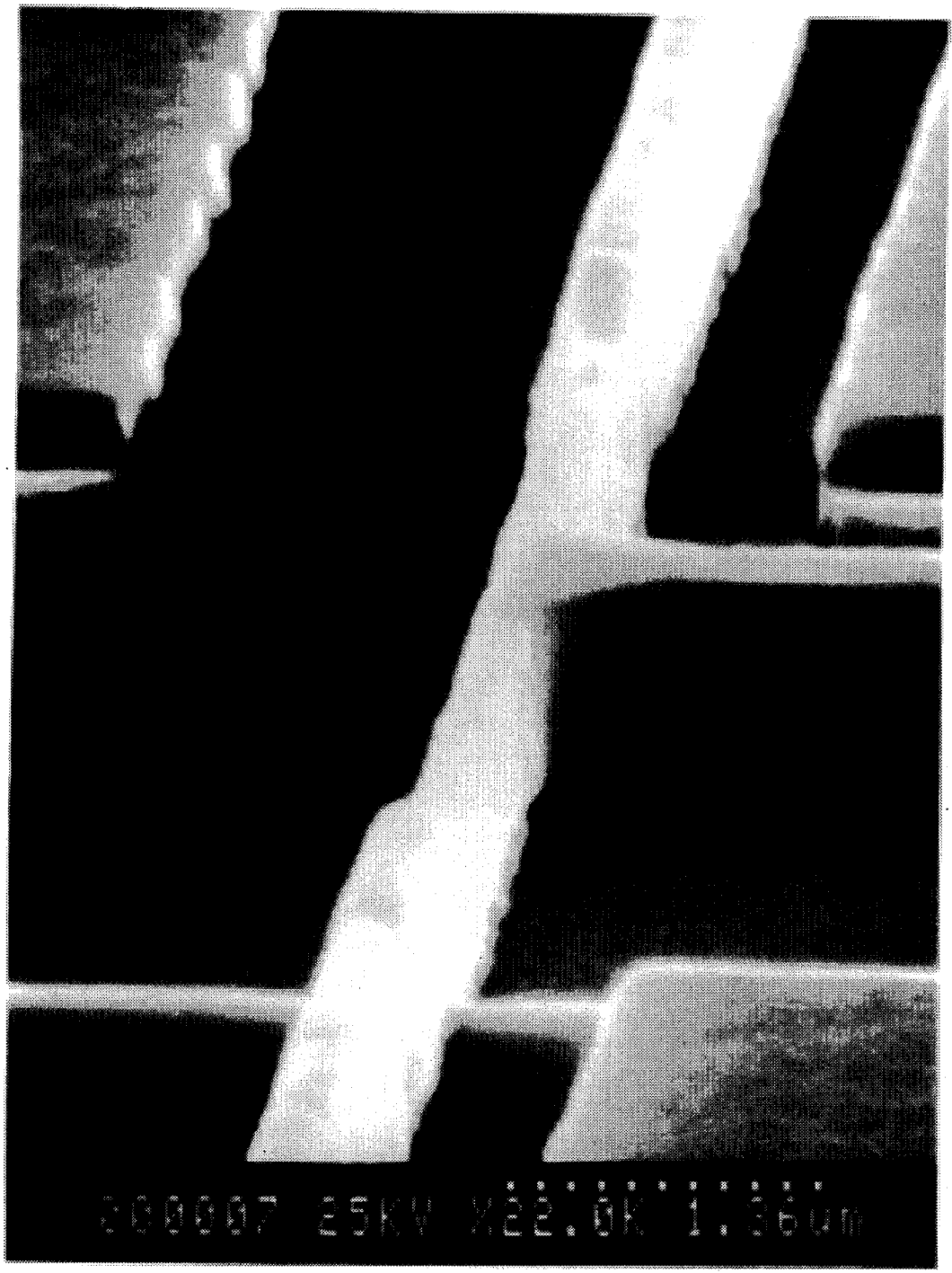
FIG. 4 is a scanning electron micrograph showing a detail of a device fabricated according to the invention.

FIG. 3 shows a scanning electron micrograph of a 0.6 by 200 micrometer device fabricated using the technique described herein. Device yield was exceptionally high with only one failure out of fifty randomly selected devices. FIG. 4 is a scanning electron micrograph showing a detail of the device shown in FIGS. 2f and 1g. Note the planar structure with no evidence of a gate recess, the large height to width aspect ratio of the gate finger and the good step coverage over the mesa step.

Figure 5:
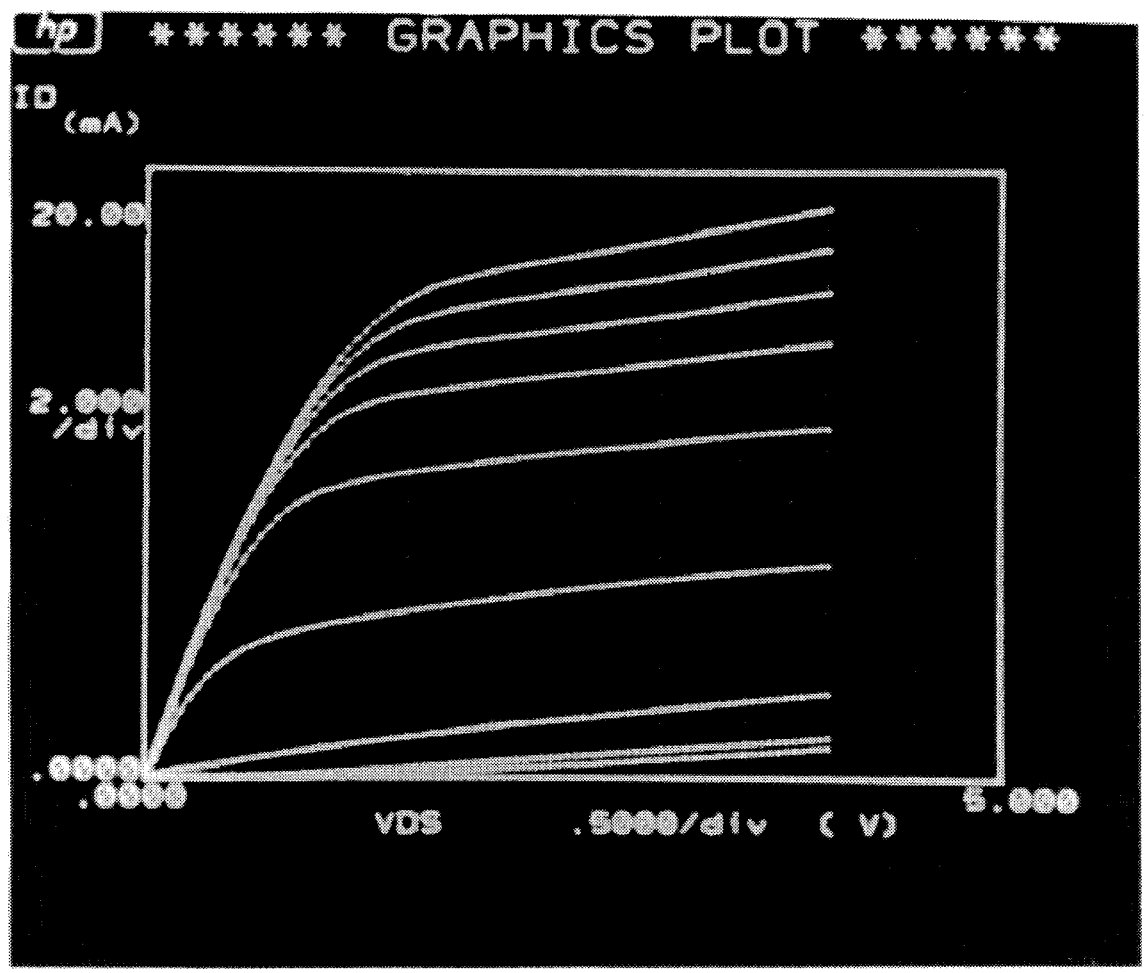
FIG. 5 is a parametric analyzer photo showing characteristics of a HEMT fabricated according to the invention.

FIG. 5 is parametric analyzer photograph showing typical HEMT characteristics from a demonstration wafer. The highest gate potential is 1 volt and the remaining traces show even steps in gate potential separated by −0.5 volts. The characteristics clearly show the classic HEMT behavior with the transconductance maximum at some point between pinch-off (in this case about −1.5 volts) and maximum forward bias. Despite the fact that the contact resistance is not optimum on this wafer and the gate length is greater than 0.5 micrometers, the transconductance is still quite high (210 mS/mm).

Figure 6:
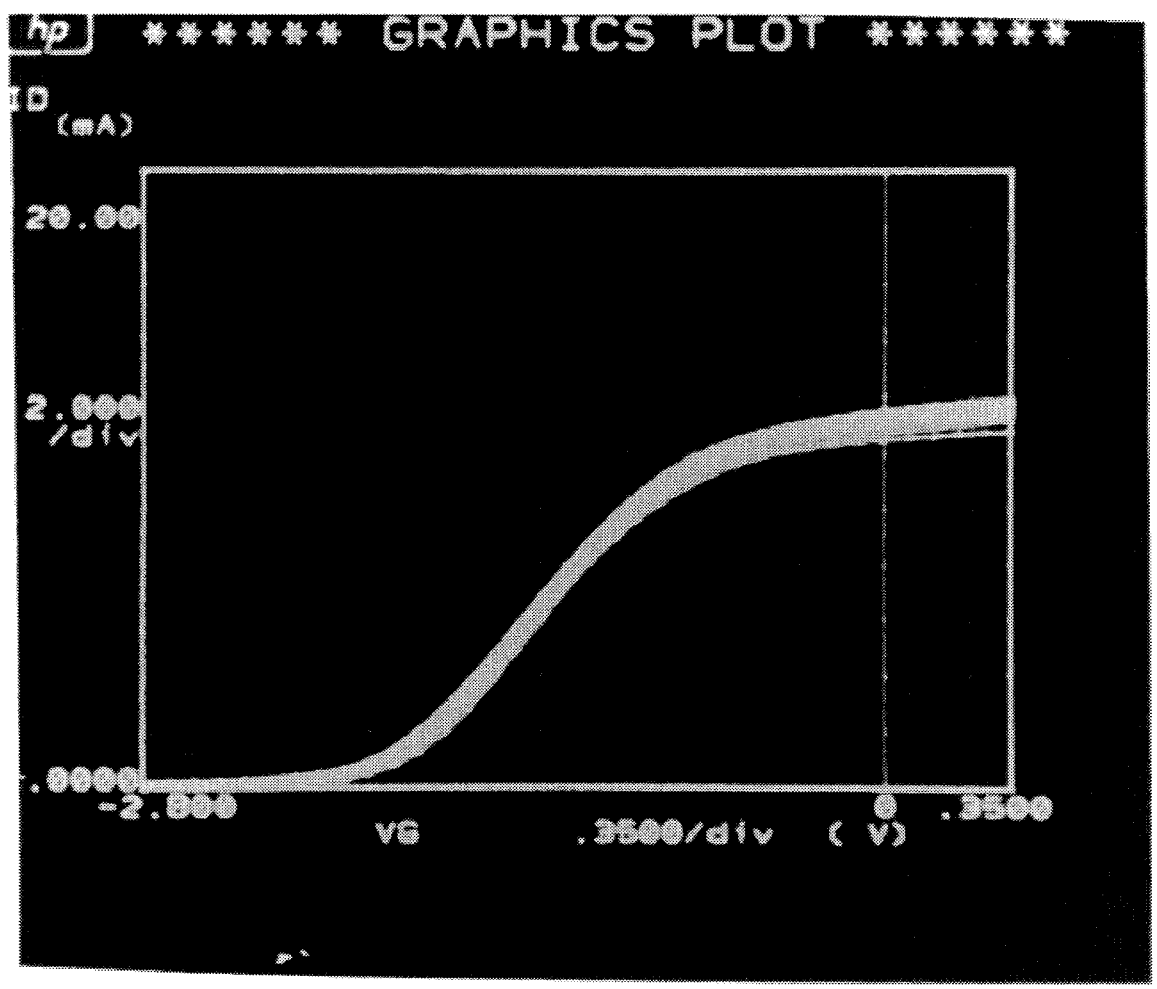
FIGS. 6 and 7 are parametric analyzer photos of devices fabricated according to the invention.
Figure 7:
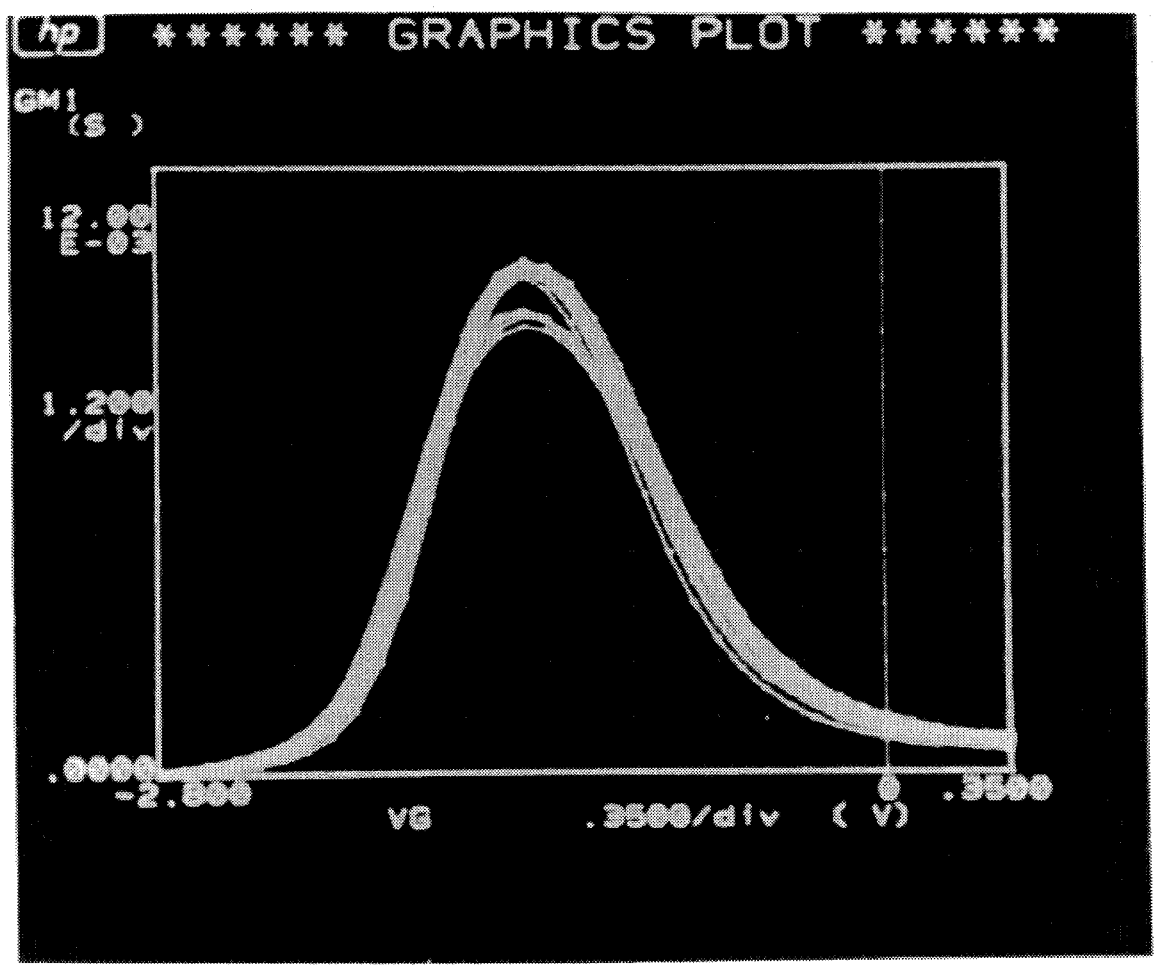

FIGS. 6 and 7 show parametric analyzer photos demonstrating the uniformity of the gate reaction. Fifteen random devices from one quarter of a two-inch wafer were evaluated. Note that the range of the drain source saturation current ($I_{DSS}$) is 12.5 to 13.5 milliampers or only 8% of the mean value. Since all the devices tested fall in this range, the 3 sigma error is only 4% of the mean. The range of transconductance is 195 to 225 mS/mm, about 15% of the mean. The range of bias value over which the maximum occurs is −1.4 to −1.6 volts. Other parameters were tested on-wafer to deduce the starting material uniformity. These revealed that the gate "chew-in" step (the step in which the platinum is consumed with the gallium arsenide cap layer) did not appreciably add to the variation. In conventional recessed structures, the overwhelming contribution to the variation in device parameters comes from the gate recess.

Accordingly, it should be understood that although the invention has been described and shown for particular embodiments, nevertheless various changes and modifications obvious to a person of ordinary skill in the art to which the invention pertains are deemed to lie within the spirit and scope of the invention as set forth in the following claims.

What is claimed:

1. A high electron mobility transistor (HEMT), comprising:

a current carrying active layer formed of an epitaxial layer of gallium arsenide (GaAs) on a semi-insulating substrate, the active layer including source and drain regions;

a gate layer of aluminum gallium arsenide (AlGaAs) on the active layer;

a Schottky barrier layer on the gate layer, the Schottky barrier layer being formed of a metal alloy comprising platinum gallium (PtGa) and platinum arsenide (PtAs);

a diffusion barrier layer of titanium nitride (TiN) on the Schottky barrier; and ohmic contacts formed on the gate, source and drain regions.

2. The HEMT of claim 1 further comprising successive layers of titanium and gold on the diffusion barrier.

3. The HEMT of claim 1 further comprising a cap of GaAs on the gate layer.

4. The HEMT of claim 1 wherein the thickness of the Schottky barrier layer is from 200 to 800 Angstroms.

* * * * *